United States Patent
Kim et al.

(10) Patent No.: US 7,020,011 B2
(45) Date of Patent: Mar. 28, 2006

(54) HIGH DENSITY MAGNETORESISTANCE MEMORY AND MANUFACTURING METHOD THEREOF

(75) Inventors: Eun-sik Kim, Seoul (KR); Yong-su Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 102 days.

(21) Appl. No.: 10/714,609

(22) Filed: Nov. 18, 2003

(65) Prior Publication Data

US 2004/0240267 A1 Dec. 2, 2004

(30) Foreign Application Priority Data

Jun. 2, 2003 (KR) .................. 10-2003-0035302

(51) Int. Cl.
 *G11C 11/00* (2006.01)

(52) U.S. Cl. .................... 365/158; 365/171; 365/173; 257/295

(58) Field of Classification Search ............. 365/158, 365/171, 173; 257/295, 421
See application file for complete search history.

(56) References Cited

U.S. PATENT DOCUMENTS

| | | | |
|---|---|---|---|
| 5,659,499 A | | 8/1997 | Chen et al. |
| 6,174,737 B1 | | 1/2001 | Durlam et al. |
| 6,211,090 B1 | * | 4/2001 | Durlam et al. ............ 438/692 |
| 6,720,597 B1 | * | 4/2004 | Janesky et al. ............ 257/295 |
| 6,812,040 B1 | * | 11/2004 | Kyler et al. .................. 438/3 |
| 6,831,312 B1 | * | 12/2004 | Slaughter et al. .......... 257/295 |

FOREIGN PATENT DOCUMENTS

| | | |
|---|---|---|
| EP | 1 246 191 A3 | 9/2002 |
| EP | 1 246 191 A2 | 10/2002 |
| KR | 2003-0062280 | 7/2003 |

OTHER PUBLICATIONS

*European Patent Office Search Report.

* cited by examiner

*Primary Examiner*—Son T. Dinh
(74) *Attorney, Agent, or Firm*—Buchanan Ingersol PC

(57) ABSTRACT

A high density magnetoresistance memory and a manufacturing method thereof are provided. The magnetoresistance memory includes: a memory cell storing information; a conductive line contacting the memory cell to change the magnetization direction of the memory cell by generating a magnetic field; and at least one flux concentrating island (FCI) located between the conductive line and the memory cell for concentrating flux onto the memory cell. The flux is concentrated onto the memory cell to reduce a required electric current and improve selectivity, thereby forming a high-density and highly integrated memory cell.

12 Claims, 6 Drawing Sheets

(2 of 6 Drawing Sheet(s) Filed in Color)

HIGH DENSITY MAGNETORESISTANCE MEMORY AND MANUFACTURING METHOD THEREOF

BACKGROUND OF THE INVENTION

This application claims the priority of Korean Patent Application No. 2003-35302, filed on Jun. 2, 2003, in the Korean Intellectual Property Office, the disclosure of which is incorporated herein in its entirety by reference.

1. Field of the Invention

The present invention relates to a high density magnetoresistance memory and a manufacturing method thereof, and particularly, to a magnetoresistance memory and a manufacturing method thereof for achieving high selectivity.

2. Description of the Related Art

FIG. 1 is a view of a conventional magnetic random access memory (MRAM) array. Referring to FIG. 1, the conventional MRAM stores information by reversing the magnetization direction of a memory cell 5 located between a digit line 1 and a bit line 3 using a magnetic field generated on the digit line 1 and the bit line 3 to which electric current is applied. However, the magnetic field generated due to the electric current applied to the digit line 1 and the bit line 3 may affect memory cells 7 and 9 located around the memory cell 5 which is at a point where the digit line 1 and the bit line 3 cross each other. Especially, in a memory cell that has gradually become compact and has a high memory density, coercivity of the memory cell increases and a current value required to reverse the magnetization direction also increases. Thus, the magnetic field affects the peripheral cells 7 and 9 beside the memory cell 5 and reverses the magnetization direction, thereby possibly increasing misoperation of the memory.

To solve the above disadvantages of the MRAM, FIG. 2 shows an example of a conventional magnetoresistance memory having a structure capable of concentrating flux onto a memory cell. FIG. 2 is a cross-sectional view of an MRAM disclosed in U.S. Pat. No. 5,659,499.

Referring to FIG. 2, MRAM 35 comprises a substrate 11 and a memory cell 14 in which information is stored as a magnetization vector on the substrate 11. The memory cell 14 is made of a magnetoresistive (MR) material having a multi-layer structure including an insulating layer between magnetic materials, and having a length 21 (L) designated by an arrow and a width perpendicular to the ground. A column conductive material 12 is used to connect the memory cell 14 of a column shape to another memory cell. A dielectric material 13 is applied on the memory cell 14 and the conductive material 12 so as to insulate them from a conductive material 36 of the digit line. The conductive material 36 of the digit line is arranged to cross the memory cell 14 at a right angle. High-permeability materials 17 and 18 are applied on an upper surface and a side surface of the conductive material 36, which is on the digit line to change the magnetization direction according to the electric current applied to the digit line conductive material 36 and to focus the magnetic field onto the magnetic material in the memory cell 14. High-permeability materials 31 and 32 are formed on left and right upper portions of the memory cell 14 as strips to support the flux focusing function of the high-permeability materials 17 and 18. A distance 37 between the high permeable materials 32 and 33 is formed to be smaller than the width of the memory cell 14.

U.S. Pat. No. 6,174,737 also discloses an improved MRAM and manufacturing method thereof similar to the MRAM structure disclosed in U.S. Pat. No. 5,659,499. However, the conventional conductive layer for focusing the flux is formed as a stripe pattern on an upper portion of the bit line or the digit line to distribute the flux on a portion where the memory cell is not located, and thus, the flux cannot be focused effectively on the desired memory cell. Also, the stripe pattern should be fabricated after forming the memory cell, and therefore, it is not easy to perform the manufacturing processes.

SUMMARY OF THE INVENTION

The present invention provides a magnetoresistance memory having a flux concentration structure by which the flux can be concentrated effectively onto a memory cell and a manufacturing method of the magnetoresistance memory.

According to an aspect of the present invention, there is provided a magnetoresistance memory comprising: a memory cell storing information; a conductive line contacting the memory cell for changing magnetization direction of the memory cell by generating a magnetic field; and at least one flux concentrating island (FCI) located between the conductive line and the memory cell for concentrating flux onto the memory cell.

According to another aspect of the present invention, there is provided a method of manufacturing a magnetoresistance memory comprising: forming a memory cell and a conductive line applying an electric current to the memory cell on a substrate; and forming an FCI concentrating flux onto the memory cell between the memory cell and the conductive line.

The conductive line may be a bit line or a digit line which is formed to cross the bit line at a right angle while interposing the memory cell between the bit line and the digit line.

The conductive line may include a flux concentrating layer (FCL) for concentrating the flux onto the memory cell on a surface which does not contact the memory cell.

The FCI and the FCL may be formed using a material having high permeability.

The FCI and the FCL may improve selectivity by 5% or more.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other features and advantages of the present invention will become more apparent by describing in detail exemplary embodiments thereof with reference to the attached drawings in which.

DETAILED DESCRIPTION OF THE INVENTION

Figure 3:
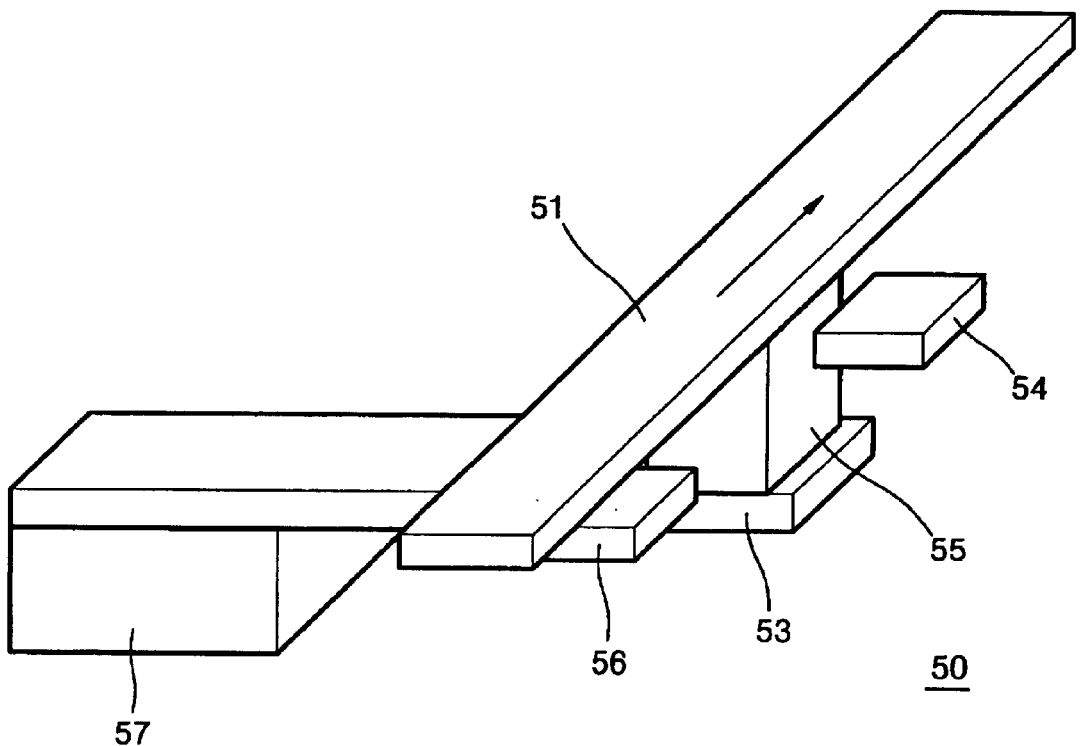
FIG. 3 is a perspective view of a magnetoresistance memory according to an embodiment of the present invention.

FIG. 3 is a perspective view of a magnetoresistance memory according to an embodiment of the present invention. Referring to FIG. 3, the magnetoresistance memory 50 comprises: a bit line 53 formed as a stripe on a substrate 57; a memory cell 55 disposed on the bit line 53; a digit line 51 contacting an upper surface of the memory cell 55 and formed as a stripe so as to cross the bit line 53 at a right angle; a flux concentrating island (FCI) for bit line 56 located adjacent to the bit line 53 that mainly concentrates a magnetic field generated from the bit line 53 onto the memory cell 55; and an FCI for digit line 54 located adjacent to the digit line 51 that mainly concentrates a magnetic field generated from the digit line 51 onto the memory cell 55. At that time, insulating layers are disposed between all components so that the components do not contact each other physically.

When the electric current is required to record onto the magnetoresistance memory, a large amount of heat is generated due to the electric current and the heat affects the adjacent cells, and thus, the probability of switching the magnetization direction of undesired magnetoresistance memory cell increases. Also, when the magnetoresistance memory is highly condensed by configuring the memory to be highly integrated, the size of the memory cell becomes smaller and coercivity is increased. Thus, increasing the intensity of the magnetic field required to switch the magnetization direction and increasing the required electric current.

In the magnetic memory according to the embodiment of the present invention, the FCI, which is made of a material having high permeability, is formed around the memory cell which is configured to be highly integrated so as to change the path of a magnetic field generated on the bit line 53 and the digit line 51, thereby concentrating the magnetic field being emitted outward onto a desired memory cell. Thus, a sufficient magnetic field that is able to switch the magnetization direction of the memory cell with a small amount of electric current can be applied only to the desired memory cell. The FCI can be formed variously as a square, a rectangle, or a circle.

Figure 1:
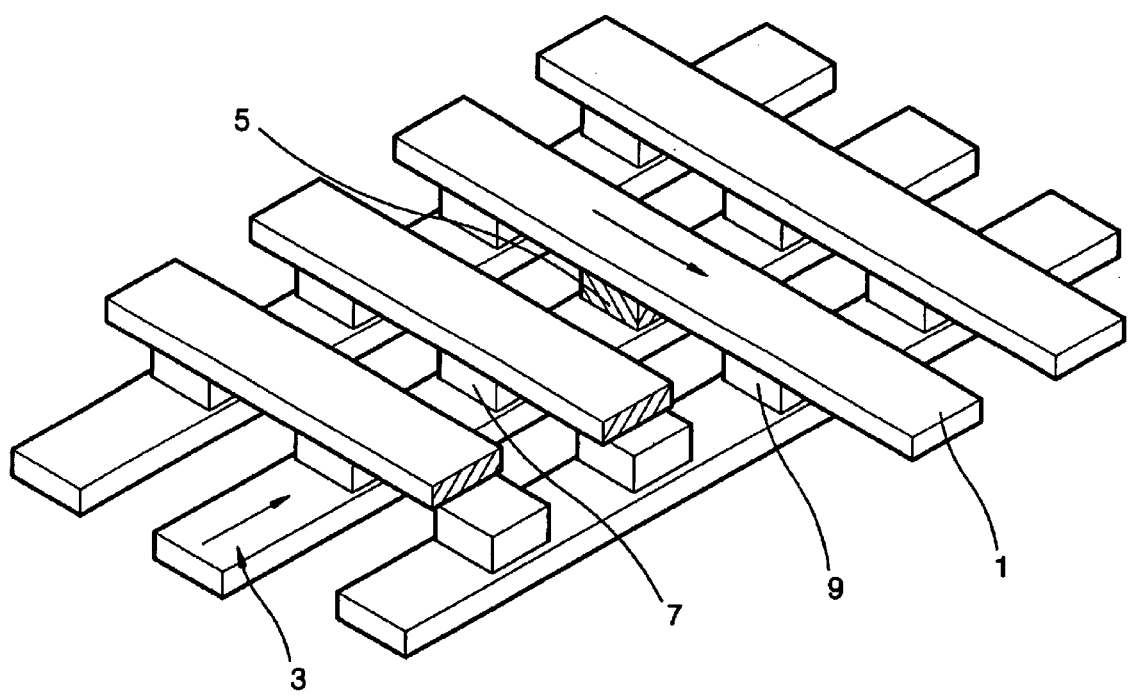
FIG. 1 is a view of a conventional magnetic random access memory (MRAM)
Figure 2:
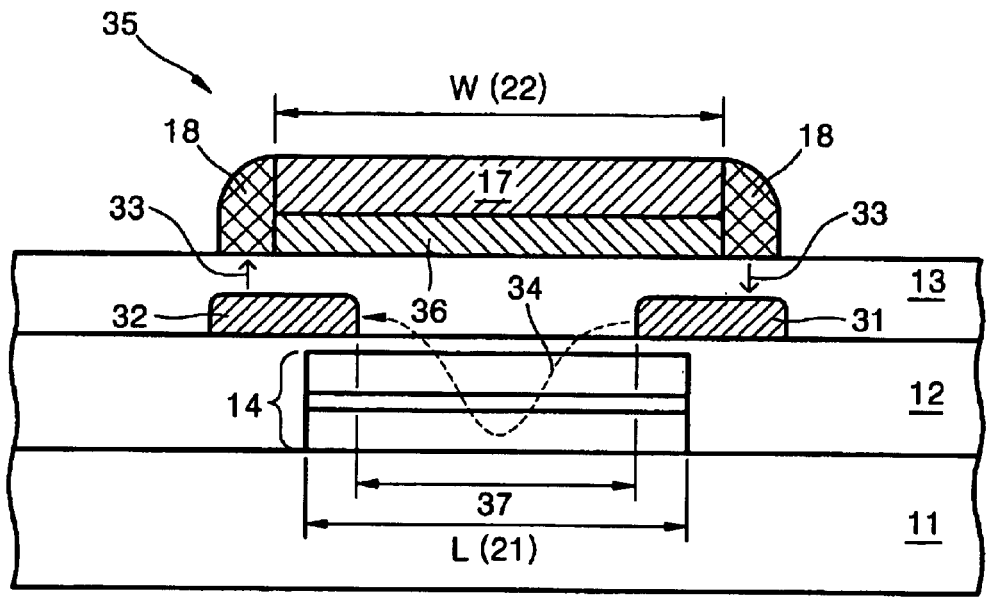
FIG. 2 is a cross-sectional view of an MRAM disclosed in U.S. Pat. No. 5,659,499.

The magnetoresistance memory of FIG. 3 is formed of a conductive material of an island shape around the memory cell 53 in order to concentrate the flux, however, a flux concentrating layer (FCL) shown in FIG. 1 may be further formed on the digit line 51 to improve the flux concentrating effect. However, in a case where the FCL is adopted, it should be noted that a process is added and the processing cost may increase.

Figure 4A:
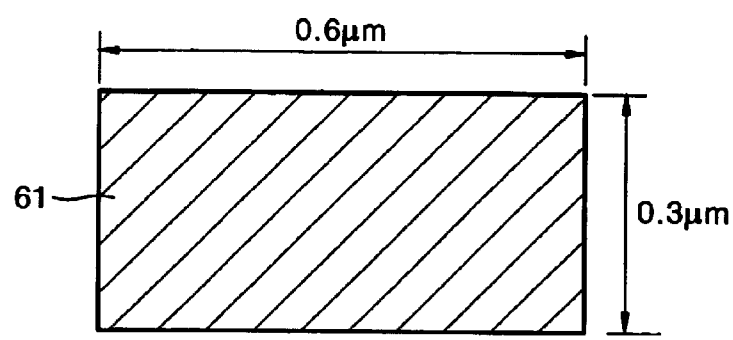
FIG. 4A is a cross-sectional view of a conductive line if there is no flux concentrating island (FCI)
Figure 4B:
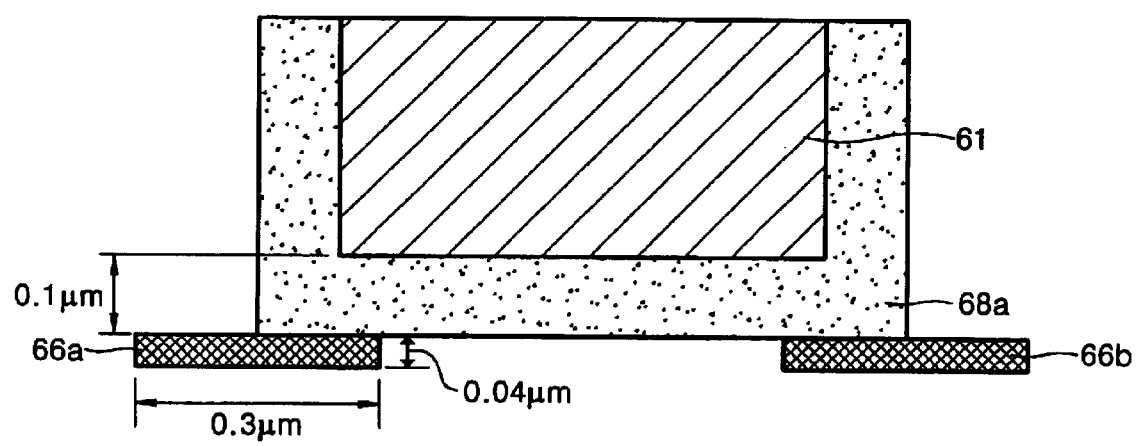
FIG. 4B is a cross-sectional view of a conductive line on which the FCI is disposed.
Figure 4C:
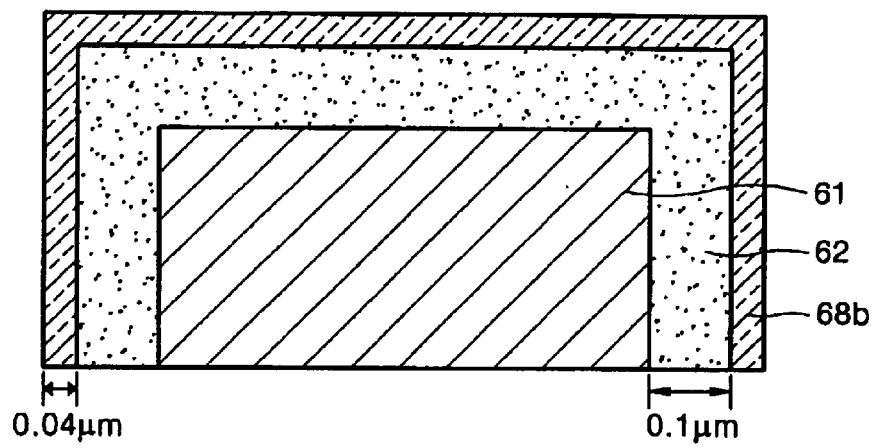
FIG. 4C is a cross-sectional view of a conductive line on which a flux concentrating layer (FCL) is disposed.
Figure 4D:
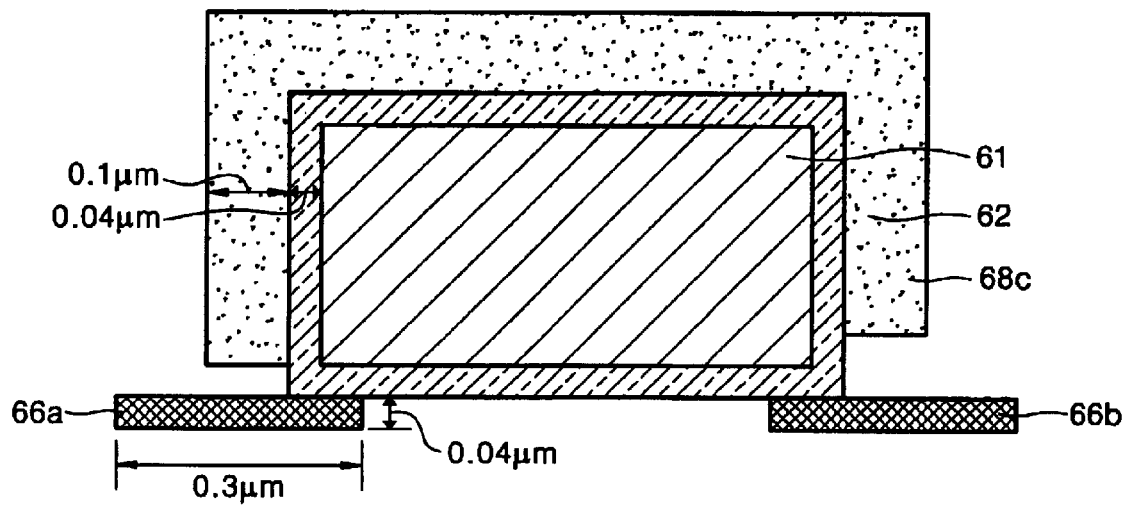
FIG. 4D is a cross-sectional view of a conductive line on which an FCI and an FCL are disposed.

FIG. 4A is a cross-sectional view of a conductive line if there is no FCI, FIG. 4B is a cross-sectional view of a conductive line on which the FCI is disposed, FIG. 4C is a cross-sectional view of a conductive line on which the FCL is disposed, and FIG. 4D is a cross-sectional view of a conductive line on which the FCI and the FCL are disposed. Here, the conductive line may be the bit line or the digit line.

The conductive line 61 of FIG. 4A has a width of 0.6 μm and a height of 0.3 μm, and does not include a flux concentrating configuration, such as the FCI and/or the FCL.

Referring to FIG. 4B, an insulating layer 68a is applied to the side surfaces and a lower surface of the conductive line 61, and the FCIs 66a and 66b are formed on the left and right lower surfaces of the insulating layer 68a. The insulating layer 68a is deposited to have a width of about 0.1 μm, and the FCIs 66a and 66b are formed to have a width of about 0.3 μm and a thickness of about 0.04 μm.

Regarding the conductive layer 61 of FIG. 4C, the FCL 62 is applied on the side surfaces and a lower surface of the insulating layer 68b instead of the FCIs 66a and 66b of FIG. 4B. Herein, the FCL 62 is formed to have a thickness of about 0.04 μm. FIG. 4D is a cross-sectional view of the conductive line 61 on which the FCL 62 and the FCIs 66a and 66b are formed. The thickness of the insulating layer is about 0.1 μm, the FCIs 66a and 66b are formed to be at the same size as that of FIG. 4B and the FCL 62 is formed to be of the same size as that of FIG. 4C.

FIGS. 5A through 5D are views of simulation results of applying an electric current to selected memory cells in the respective cases shown in FIGS. 4A through 4D. Referring to FIGS. 5A through 5D, nine memory cells are arranged, and lines of a magnetic force are formed upward from the memory cell located on the right side of the selected memory cell at the center portion and are formed downward from the memory cell located on the left side of the selected memory cell.

Figure 5A:
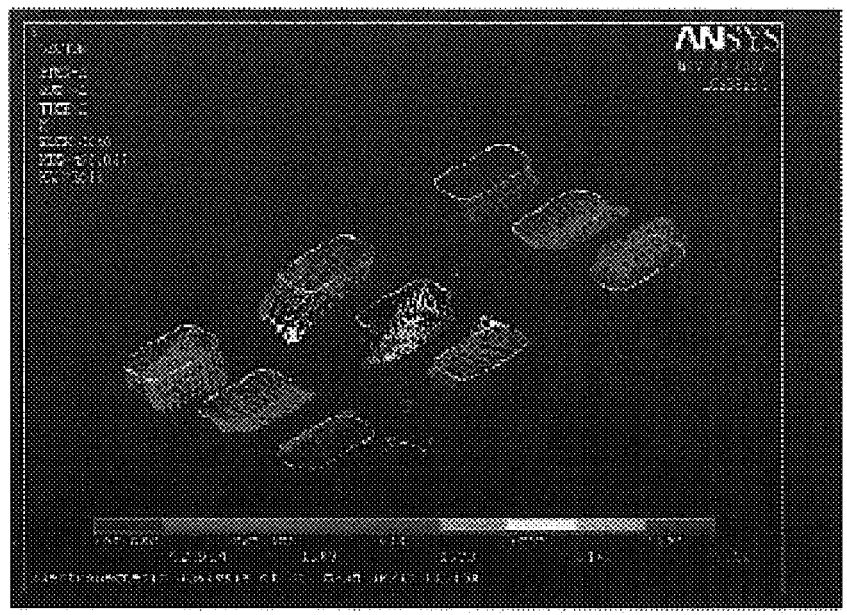
FIGS. 5A through 5D are views of results of simulations in which an electric current is applied to respective memory cells shown in FIGS. 4A through 4D.
Figure 5B:
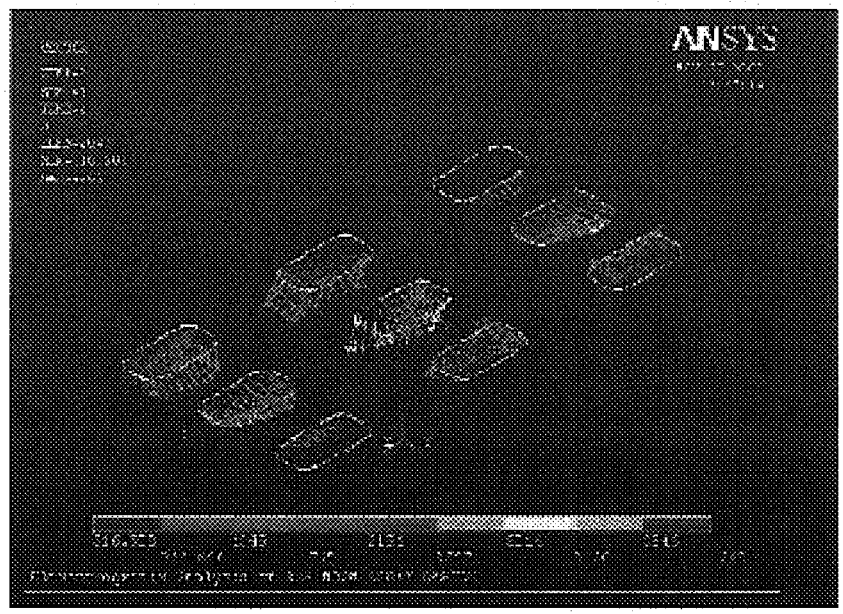
Figure 5C:
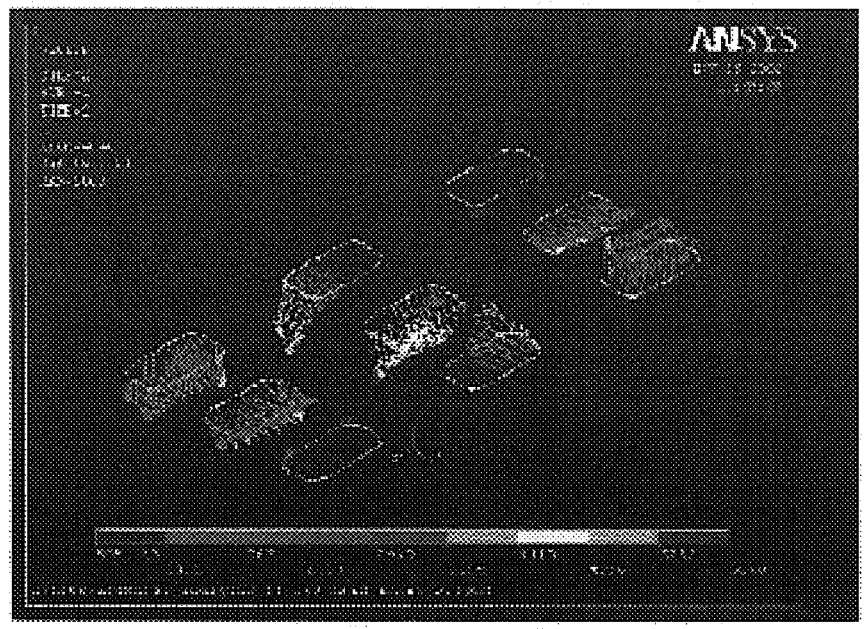
Figure 5D:
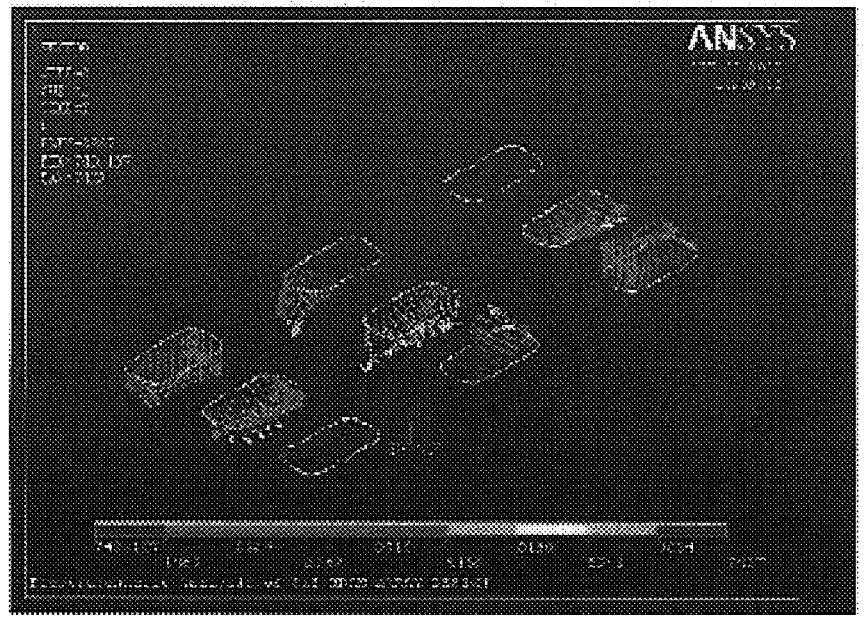

The gradual increase of the intensities of the magnetic fields of the memory cells in FIGS. 4A and 4B can be known from the scroll bars of FIGS. 5A and 5B representing the intensities of the magnetic fields. The maximum intensity of the memory cell is about 2612(G) in FIG. 5A, about 4262(G) in FIG. 5B, about 5868(G) in FIG. 5C, and about 7427(G) in FIG. 5D. The intensity of the magnetic field is noted to be strongest from the simulation results in a case where the FCI according to the present invention and the conventional FCL are used together.

Table 1 shows an x-axis, a y-axis, a required current, and the selectivity for respective cases 1, 2, 3, and 4 shown in FIGS. 4A through 4D.

TABLE 1

|  | Hx(Oe) | Hy(Oe) | Required current (mA) | Selectivity (%) |
|---|---|---|---|---|
| Case 1 | 20.7 | 22.0 | 8.5 | 178 |
| Case 2 | 21.9 | 27.5 | 7.5 | 192 |
| Case 3 | 31.0 | 45.4 | 4.7 | 182 |
| Case 4 | 31.1 | 53.5 | 4.5 | 196 |

Here, the required current means the electric current required to reverse the magnetization direction of the memory cell, and the selectivity is defined as Equation 1 shown below, that is, a relational expression between a magnetic field ($H_{x0}$, $H_{y0}$) applied to a selected memory cell and a magnetic field ($H_{x1}$, $H_{y1}$) applied to an adjacent memory cell. The higher the selectivity is, the higher the concentration of the magnetic field toward the selected memory cell is.

$$selectivity = 2 \Big/ \left( \sqrt{((H_{x1}/H_{x0})^2 + (H_{y1}/H_{y0})^2)/2} + \sqrt{((H_{x2}/H_{x0})^2 + (H_{y2}/H_{y0})^2)/2} \right) \quad \text{[Equation 1]}$$

Referring to Table 1, the strongest intensity of a magnetic field (Hx) in an x-axis direction is about 31(Oe) in cases 3 and 4, and the strongest intensity of a magnetic field (Hy) in a y-axis direction is about 45(0e) in case 3 and about 53(0e) in case 4. The required current is smallest in cases 3 and 4 amounting to about 4.5 through 4.7.

However, the selectivity is largest in cases 2 and 4 ranging from about 192% to 196%. The selectivity of case 2 is improved in that it amounts to about 8% more than the selectivity of case 1, that is, 178%. It is preferable that the selectivity of the magnetoresistance memory is designed to be improved by 5% or more.

From the above results, the magnetoresistance memory including the FCI functions more effectively in view of selectivity, and shows the best functionality in views of the intensity of the magnetic field, the required current, and the selectivity in a case where the FCI and the FCL are disposed. Optimal conditions of thickness and width of the FCI can be found through experiments.

The magnetic material, which is the same as the magnetoresistance memory cell, can be used as the FCI. Thus, the desired structure can be achieved without increasing the processes by using a mask of the same shape as that of the FCI when the memory cell is etched in the manufacturing process.

The magnetoresistance memory according to the present invention includes the flux concentration structure to increase the flux density per unit current applied to the memory cell, thereby, reducing the required current which is needed to switch the magnetization direction of the cell and improving the selectivity so as to manufacture the high density magnetoresistance memory.

As described above, the magnetoresistance memory according to the present invention has advantages in that it reduces the required current and improves the selectivity by increasing the flux density per unit current, thereby a high-density and highly integrated structure can be achieved easily.

Also, the manufacturing method of the magnetoresistance memory according to the present invention has an advantage in that the FCI can be fabricated by simply changing the mask which is required in the etching process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A magnetoresistance memory comprising:
   a memory cell storing information;
   a conductive line contacting the memory cell to change the magnetization direction of the memory cell by generating a magnetic field; and
   at least one flux concentrating island located between the conductive line and the memory cell for concentrating flux onto the memory cell.

2. The memory of claim 1, wherein the conductive line is a bit line or a digit line which is formed to cross the bit line at a right angle while interposing the memory cell between the bit line and the digit line.

3. The memory of claim 1, wherein the conductive line includes a flux concentration layer for concentrating the flux onto the memory cell on a surface which does not contact the memory cell.

4. The memory of claim 1, wherein the flux concentrating island is formed using a material having high permeability.

5. The memory of claim 1, wherein the flux concentrating layer is formed using a material having high permeability.

6. The memory of claim 1, wherein the flux concentrating island improves selectivity by 5% or more.

7. A method of manufacturing a magnetoresistance memory comprising:
   forming a memory cell and a conductive line by applying electric current to the memory cell on a substrate; and
   forming a flux concentrating island, which concentrates flux onto the memory cell, between the memory cell and the conductive line.

8. The method of claim 7, wherein the conductive line is a bit line or a digit line which is formed to cross the bit line at a right angle while interposing the memory cell between the bit line and the digit line.

9. The method of claim 7, further comprising forming a flux concentration layer concentrating the flux onto the memory cell on a surface which does not contact the memory cell.

10. The method of claim 7, wherein the flux concentrating island is formed using a material having high permeability.

11. The method of claim 9, wherein the flux concentration layer is formed using a material having high permeability.

12. The method of claim 7, wherein the flux concentrating island improves the selectivity by 5% or more.

* * * * *